(12) United States Patent
Ishii et al.

(10) Patent No.: US 7,932,668 B2
(45) Date of Patent: Apr. 26, 2011

(54) ORGANIC ELECTROLUMINESCENCE DEVICE AND METHOD OF MANUFACTURING ORGANIC ELECTROLUMINESCENCE DEVICE

(75) Inventors: Ryuji Ishii, Chino (JP); Masaki Ito, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 284 days.

(21) Appl. No.: 11/861,760

(22) Filed: Sep. 26, 2007

(65) Prior Publication Data

US 2008/0079357 A1 Apr. 3, 2008

(30) Foreign Application Priority Data

Sep. 29, 2006 (JP) ................... 2006-269922

(51) Int. Cl.
*H01L 51/54* (2006.01)
*H01L 51/56* (2006.01)
(52) U.S. Cl. ........ 313/504; 313/500; 313/503; 313/505; 313/506; 445/24

(58) Field of Classification Search .......... 313/495–512; 445/24–25
See application file for complete search history.

(56) References Cited

U.S. PATENT DOCUMENTS

2007/0034859 A1 2/2007 Tierney et al.

FOREIGN PATENT DOCUMENTS

| JP | A-2002-75646 | 3/2002 |
|---|---|---|
| JP | A 2003-187970 | 7/2003 |
| JP | A-2005-129450 | 5/2005 |
| JP | A 2005-235569 | 9/2005 |
| JP | A-2006-237083 | 9/2006 |
| JP | A-2006-521008 | 9/2006 |
| JP | A-2007-134693 | 5/2007 |

*Primary Examiner* — Bumsuk Won
*Assistant Examiner* — Elmito Breval
(74) *Attorney, Agent, or Firm* — Oliff & Berridge, PLC

(57) ABSTRACT

An organic electroluminescence device includes a pair of electrodes; a hole injection layer and a luminescent layer disposed between the pair of electrodes; and a mixing-preventing layer disposed between the hole injection layer and the luminescent layer and preventing mixing of the material constituting the hole injection layer and the material constituting the luminescent layer.

7 Claims, 3 Drawing Sheets

FIG. 3

| MIXING-PREVENTING FILM THICKNESS (nm) | STATIC CONTACT ANGLE (°) | | INITIAL BRIGHTNESS | INITIAL EFFICIENCY | LIFETIME |
|---|---|---|---|---|---|
| | TOLUENE | WATER | | | |
| 0 | <5 | — | 1 | 1 | 1 |
| 0.5 | 23.2 | 77.2 | 0.92 | 0.94 | 1.1 |
| 1 | 39.8 | 82.1 | 0.88 | 0.89 | 1.4 |
| 3 | 48.9 | 93.5 | 0.76 | 0.81 | 1.4 |
| 5 | 50.1 | 104 | 0.61 | 0.69 | 1.2 |

ORGANIC ELECTROLUMINESCENCE DEVICE AND METHOD OF MANUFACTURING ORGANIC ELECTROLUMINESCENCE DEVICE

BACKGROUND

1. Technical Field

The present invention relates to an organic electroluminescence device and a method of manufacturing an organic electroluminescence device.

2. Related Art

Recently, organic electroluminescence devices (hereinafter referred to as organic EL devices) in which luminescent materials such as organic fluorescent materials are disposed between electrodes have been widely developed. In such an organic EL device, a hole injection layer is generally disposed on a luminescent layer at an anode side in order to enhance luminescence efficiency of the luminescent layer composed of an organic material. This hole injection layer is formed of, for example, 3,4-polyethylenedioxythiophene/polystyrenesulfonic acid [PEDOT/PSS] (for example, refer to JP-A-2003-187970).

In the organic EL device disclosed in the above-mentioned JP-A-2003-187970, a mixing layer is formed with lapse of time at the interface of the hole injection layer and the anode due to the mixing of both materials. Since the mixing layer cannot serve as a luminescent layer, an organic EL element is degraded and the lifetime of the organic EL device is shortened.

SUMMARY

An advantage of some aspects of the invention is to provide an organic electroluminescence device having a long lifetime by preventing the formation of a mixing layer at the interface of a hole injection layer and an anode. Another advantage of some aspects of the invention is to provide a method of manufacturing such an organic electroluminescence device.

In the organic electroluminescence device according to an aspect of the present invention, a hole injection layer and a luminescent layer are disposed between a pair of electrodes, and a mixing-preventing layer is disposed between the hole injection layer and the luminescent layer. The mixing-preventing layer prevents mixing of the material constituting the hole injection layer and the material constituting the luminescent layer.

In the organic electroluminescence device according to an aspect of the present invention, since the mixing-preventing layer is disposed between the hole injection layer and the luminescent layer, the hole injection layer and the luminescent layer are not brought into direct contact with each other. Thereby, the materials of those layers are not mixed, and the formation of a mixing layer is prevented. Consequently, degradation of an element caused by the formation of such a mixing layer can be inhibited, and the lifetime of the element can be extended, as shown in the results of the experiment below.

In the above-mentioned organic electroluminescence device, a mixing-preventing layer composed of a material containing a fluorine group-containing high molecular material as a main ingredient is preferred.

In such a structure, since the mixing-preventing layer is made of a fluorine compound, which is excellent in non-adhesive properties, the hole injection layer and the luminescent layer hardly adhere to each other, and the formation of a mixing layer is effectively prevented.

In the organic electroluminescence device, a mixing-preventing layer having a thickness of 5 nm or less is preferred.

In such a structure, the formation of a mixing layer can be prevented and, thereby, the lifetime of the device can be extended, as shown in the results of the experiment below.

A method of manufacturing an organic electroluminescence device according to an aspect of the present invention is to manufacture the organic electroluminescence device having a hole injection layer and a luminescent layer between a pair of electrodes by forming the hole injection layer, forming a mixing-preventing layer preventing mixing of the hole injection layer and the luminescent layer on the hole injection layer, and forming the luminescent layer on the mixing-preventing layer.

In the method of manufacturing an organic electroluminescence device according to an aspect of the present invention, since the mixing-preventing layer is formed between the hole injection layer and the luminescent layer, the hole injection layer and the luminescent layer are prevented from being brought into direct contact with each other. Thus, the formation of a mixing layer by mixing the materials of both layers is effectively prevented. Consequently, degradation of an element caused by the formation of such a mixing layer can be inhibited, and the lifetime of the element can be extended, as shown in the results of the experiment below.

In the above-mentioned method of manufacturing an organic electroluminescence device, the mixing-preventing layer is preferably formed by a liquid-phase method by applying a fluorine group-containing high molecular precursor monomer on the hole injection layer and thermally curing the high molecular precursor monomer for crosslinking and polymerization.

In such a procedure, the mixing-preventing layer can be favorably formed on the hole injection layer, and the lifetime of the organic EL device can be extended.

In the above-mentioned method of manufacturing an organic electroluminescence device, the mixing-preventing layer is preferably formed so as to have a thickness of 5 nm or less.

In such a structure, the formation of a mixing layer can be prevented, and thereby the lifetime of the device can be extended, as shown in the results of the experiment below.

BRIEF DESCRIPTION OF THE DRAWINGS

FIG. 3 is a table showing the results of the experiment for confirming significant advantages of the present invention.

DESCRIPTION OF EXEMPLARY EMBODIMENTS

The invention will be described with reference to the accompanying drawings, wherein the thickness and the dimensional ratios of individual elements drawn in all the figures are optionally changed for facilitating understanding of the structure.

Figure 1:
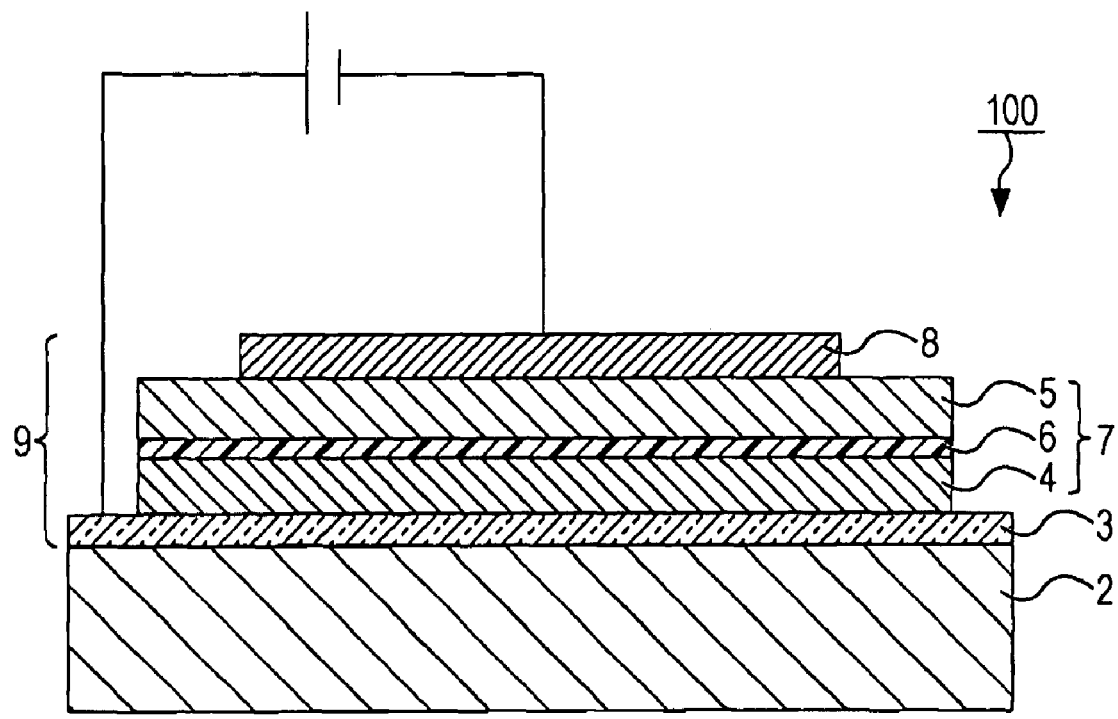
FIG. 1 is a schematic diagram illustrating an organic EL device according to an embodiment of the present invention.

FIG. 1 is a schematic diagram illustrating an organic EL device according to an embodiment of the present invention. The organic EL device 100 according to this embodiment is a bottom-emission type, and light emitted from an organic EL element 9 is projected to the outside through a base material 2 composed of, for example, a glass substrate.

The organic EL device 100 includes the base material 2, an anode (electrode) 3, a hole injection layer 4, a luminescent layer 5, a cathode (electrode) 8, and a mixing-preventing layer 6. The mixing-preventing layer 6 is disposed between the hole injection layer 4 and the luminescent layer 5 and prevents mixing of the materials constituting the hole injection layer 4 and the luminescent layer 5. The hole injection layer 4, the luminescent layer 5, and the mixing-preventing layer 6 are composed of organic materials and form an organic functional layer 7. The organic functional layer 7 is disposed between the anode 3 and the cathode 8. The anode 3, the organic functional layer 7, and the cathode 8 form the organic EL element 9.

The anode 3 and the cathode 8 are connected to wiring for applying a driving voltage. The application of a driving voltage to between the electrodes through this wiring causes injection of electrons from the cathode 8 into the luminescent layer 5 and injection of holes from the anode 3 into the luminescent layer 5. The holes and the electrons migrate by the applied electric field in the luminescent layer 5 and are recombined with each other, and excitons are generated by the energy emitted by the recombination. These excitons are transferred to the ground state while emitting the energy in the form of fluorescent or luminescent light.

In a bottom-emission type, the anode 3 must be composed of a transparent material. In this embodiment, an anode is composed of Indium-Tin-Oxide (ITO), which is a transparent material for an electrode. The material for a transparent electrode is not limited to ITO, and, for example, Pt, Ir, Ni, or Pd may be used. In a top-emission type, in which light is emitted from the opposite side of the base material 2, the base material 2 may be composed of an opaque material. As the opaque material, ceramics such as alumina, a metal sheet treated with insulating, such as stainless steel treated with surface oxidation, a thermosetting resin, or a thermoplastic resin can be used. In such a case, the anode 3 can be composed of a light-shielding material or a light-reflective material.

The hole injection layer 4 is composed of, for example, an arylamine derivative, a phthalocyanine derivative, a combination of a polyaniline derivative and an organic acid, or a combination of a polythiophene derivative and a polymer acid. In this embodiment, a mixture of polyethylenedioxythiophene and polystyrenesulfonic acid (PEDOT/PSS) is used.

The luminescent layer 5 is disposed on the hole injection layer 4 and emits light in a predetermined wavelength range by recombination of electrons injected from the cathode 8 and holes injected from the hole injection layer 4. In this embodiment, the luminescent layer 5 is composed of F8TPD represented by formula 1. This luminescent layer 5 composed of F8TPD emits blue light.

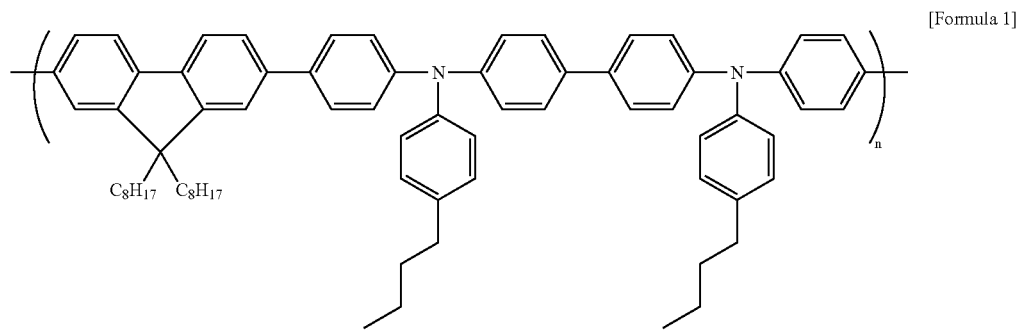

[Formula 1]

The organic EL device 100 has the mixing-preventing layer 6 between the luminescent layer 5 and the hole injection layer 4 as described above. The mixing-preventing layer 6 is a characteristic structure of the present invention and is made of a material containing a fluorine group-containing high molecular material as a main ingredient. Thus, the mixing-preventing layer 6 is made of a fluorine compound, for example, a fluoroaliphatic group-containing monomer, and, in this embodiment, 2-(perfluorooctyl)ethyl methacrylate represented by formula 2 is used. This mixing-preventing layer 6 is formed by applying a fluoroaliphatic group-containing monomer (high molecular precursor monomer) on the anode 3 and thermally curing the monomer for crosslinking and polymerization so that the layer has a thickness of 1 nm.

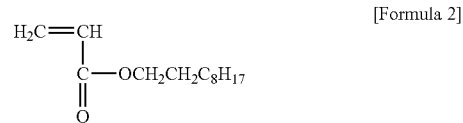

[Formula 2]

The material for the mixing-preventing layer 6 is not limited to the above, and, for example, trifluoroethyl acrylate represented by formula 3, trifluoroethyl methacrylate represented by formula 4, 3-(2-perfluorohexyl)ethoxy-1,2-epoxypropane represented by formula 5, or N-propyl-N-(2,3-epoxypropyl)perfluorooctanesulfonamide represented by formula 6 can be used.

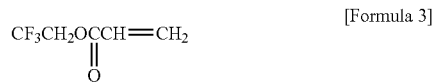

[Formula 3]

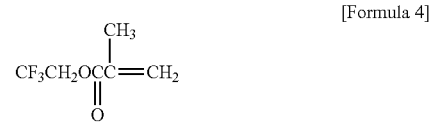

[Formula 4]

-continued

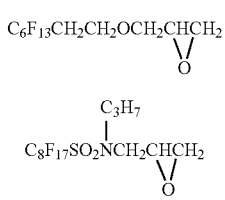

The cathode 8 is composed of a lamination of a calcium layer and an aluminum layer. In addition, the organic EL element 9 may further have a sealing member for covering the cathode 8.

Significant advantages achieved by the present invention will now be described by comparing the structure according to the present invention to an example of a conventional organic EL device not having the above-mentioned mixing-preventing layer 6.

In the conventional organic EL device, a mixing layer is formed with lapse of time at the interface of the hole injection layer and the luminescent layer by the mixing of the material (PEDOT/PSS) constituting the hole injection layer and the material (represented by the above-mentioned formula 2) constituting the luminescent layer.

Furthermore, in the conventional organic EL device being half of the lifetime, the thickness of a mixing layer is larger than a certain value. That is, it is suggested that since the mixing layer cannot serve as a luminescent layer, the organic EL element is degraded with an increase in the film thickness, and, as a result, the lifetime of the element is shortened. Therefore, by preventing mixing of the materials of the luminescent layer and the hole injection layer, the formation of the above-mentioned mixing layer is prevented and the lifetime of an organic EL device can be extended.

In the organic EL device 100 according to this embodiment, a mixing-preventing layer 6 disposed between the hole injection layer 4 and the luminescent layer 5 can prevent mixing of the materials constituting the hole injection layer 4 and the luminescent layer 5 at the interface thereof, which is caused by direct contact of the hole injection layer 4 and the luminescent layer 5 with each other. Consequently, the degradation of the organic EL element 9 due to a mixing layer can be prevented, and the lifetime of the organic EL element can be extended, as shown in the results of the experiment below.

Method of Manufacturing Organic EL Device

A method of manufacturing the organic EL device 100 will now be described with reference to the method according to an embodiment of the present invention shown in FIGS. 2A to 2D.

Figure 2A:
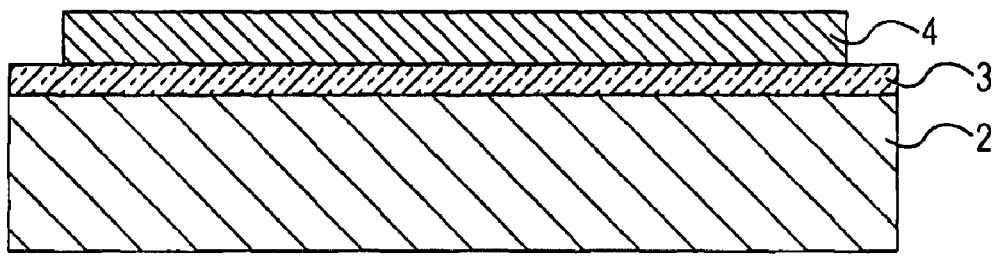
FIG. 2A is a diagram illustrating a process of manufacturing an organic EL device according to an embodiment of the present invention.

As shown in FIG. 2A, an anode 3 is formed on a base material 2 by a usual process, e.g., forming a TFT element, various wiring patterns, and the like on a glass base material 2; further forming an interlayer insulation layer and a planarizing film; then forming an ITO film by, for example, an evaporation method; and further patterning. Then, a hole injection layer 4 is formed on the anode 3 by a liquid-phase method.

The liquid-phase method may be, for example, a spin-coating method, a droplet-discharging method (ink-jetting method), a dip-coating method, or a roll-coating method. In this embodiment, the hole injection layer 4 and the luminescent layer 5 are formed by the spin-coating method.

The hole injection layer 4 is formed by applying a liquid material containing 3,4-polyethylenedioxythiophene/polystyrenesulfonic acid (PEDOT/PSS), as a material forming a hole injection layer, on the anode 3 by the spin-coating method so as to have a thickness of 80 nm and then drying and firing (at 200° C. for 10 min) the material. The solvent for the hole injection layer material may be a polar solvent such as isopropyl alcohol, N-methylpyrrolidone, or 1,3-dimethyl-imidazolinone.

Figure 2B:
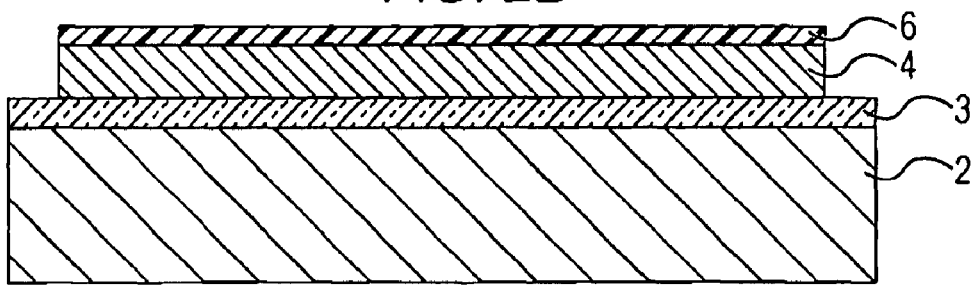
FIG. 2B is a diagram illustrating another process of manufacturing the organic EL device according to the embodiment.

Then, as shown in FIG. 2B, a mixing-preventing layer 6 is formed on the hole injection layer 4 by a spin-coating method. Specifically, a fluoroaliphatic group-containing monomer represented by the formula 2 is applied on the hole injection layer 4. The fluoroaliphatic group-containing monomer applied on the hole injection layer 4 is heated (at 200° C. for 60 min) in an inert gas (nitrogen gas) atmosphere to be thermally cured for crosslinking and polymerization. Thus, a mixing-preventing layer 6 having a thickness of 1 nm is formed on the hole injection layer 4.

The thickness of the mixing-preventing layer 6 is not limited to the above-mentioned value (1 nm). A mixing-preventing layer 6 having a thickness in the range of 0.5 to 5 nm can sufficiently achieve the function as a mixing-preventing layer 6, as shown in the results of the experiment below.

Figure 2C:
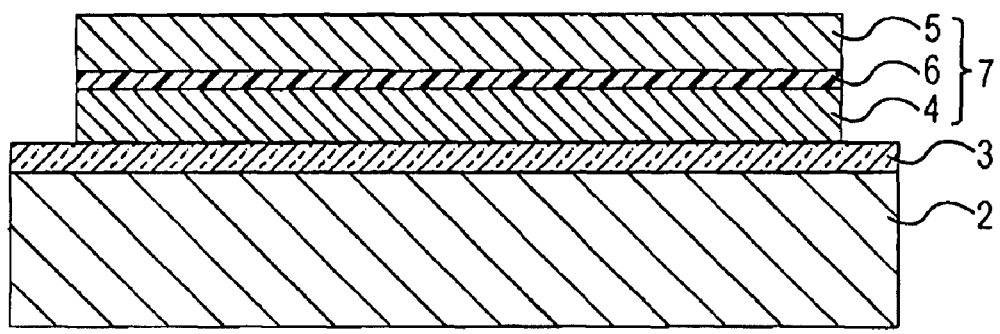
FIG. 2C is a diagram illustrating another process of manufacturing the organic EL device according to the embodiment.

Then, as shown in FIG. 2C, a luminescent layer 5 is formed on the mixing-preventing layer 6. Thus, an organic functional layer 7 is formed. In this embodiment, the luminescent layer 5 is formed by a droplet-discharging method. The partition wall (bank), which is formed during the droplet-discharging method, is omitted from the drawing.

Examples of the droplet-discharging method (ink-jetting method) include a charging control system, a pressure vibration system, an electric-mechanical conversion system, an electric-thermal conversion system, and an electrostatic suction system. The charging control system is to apply a charge to a material using charging electrodes and to control the flight direction of the material using deflecting electrodes so that the material is discharged from a nozzle. The pressure vibration system is to apply a significantly high pressure to a material so that the material is discharged toward an edge of a nozzle. In this case, when a control voltage is not applied, the material goes straight to be discharged from the nozzle. If a control voltage is applied to the material, an electrostatic repulsive force is produced, and consequently, the material is scattered and is not discharged from the nozzle. In the electric-mechanical conversion system (piezo system), which uses a property that a piezo element (piezoelectric element) is deformed when an electric pulse signal is applied thereto, a pressure is applied to a space storing a material through a flexible material by deforming a piezoelectric element, and the material is pressed out of the space to be discharged from a nozzle. The electric-thermal conversion system is to produce bubbles by rapidly vaporizing a material using a heater provided in a space storing the material and to discharge the material stored in the space by using the pressure of the bubbles. The electrostatic suction system is to apply a small pressure to a space storing a material so that meniscus of the material is formed on a nozzle and to extract the material by applying an electrostatic attraction force in this state. In addition to the above-mentioned systems, techniques, such as a system using a change in viscosity of a fluid due to an electric field or a system using discharging sparks, can also be applied. In this embodiment, the piezo system is used.

The luminescent layer 5 is formed by applying a solvent containing F8TPD represented by the formula 1 on the mixing-preventing layer 6 and heating (at 130° C. for 30 min) the solvent in an inert gas atmosphere, such as nitrogen. The solvent used for forming the luminescent layer 5 can be a nonpolar solvent such as toluene. The mixing-preventing layer 6 is insoluble to the nonpolar solvent (such as toluene)

and has a static contact angle of 39.8° (at a film thickness of 1 nm), as shown in the results of the experiment below. That is, the mixing-preventing layer 6 is repellent to the solvent.

Therefore, the mixing-preventing layer 6 is not dissolved in the solvent (toluene) containing the material for the luminescent layer 5 when the solvent is applied on the mixing-preventing layer 6. In addition, since the solvent is applied on the mixing-preventing layer 6 being repellent to the solvent, as described above, the adhesion between the mixing-preventing layer 6 and the luminescent layer 5 formed on the mixing-preventing layer 6 is reduced. Thus, the mixing-preventing layer 6 has low adhesion to both the hole injection layer 4 and the luminescent layer 5. Consequently, the hole injection layer 4 and the luminescent layer 5 hardly adhere to each other, and the formation of a mixing layer at the interface therebetween is reliably prevented.

Figure 2D:
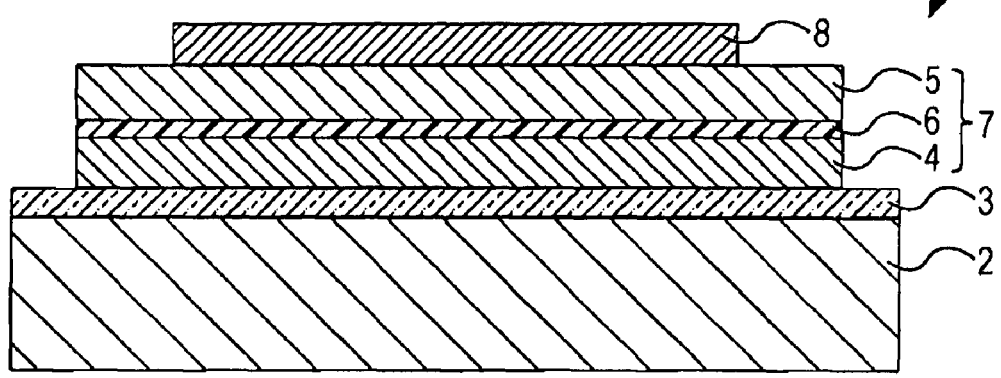
FIG. 2D is a diagram illustrating another process of manufacturing the organic EL device according to the embodiment.

Then, as shown in FIG. 2D, a cathode 8 is formed on the luminescent layer 5. The cathode 8 can be formed by, for example, laminating a calcium layer and an aluminum layer in this order by a vacuum evaporation method. Thus, an organic EL element 9 is formed on the base material 2 by the above-mentioned processes. Then, sealing may be conducted according to need to complete an organic EL device 100.

As described above, in the method of manufacturing the organic EL device 100 according to this embodiment, since the mixing-preventing layer 6 is formed between the hole injection layer 4 and the luminescent layer 5, the hole injection layer 4 and the luminescent layer 5 are prevented from direct contact with each other and the formation of a mixing layer caused by mixing of the materials of both layers can be prevented by the presence of the mixing-preventing layer 6. Consequently, degradation of the element caused by the formation of a mixing layer can be inhibited, and the lifetime of the organic EL element 9 can be extended, as shown in the results of the experiment below.

Experiment

FIG. 3 is a table showing the results of the experiment for verifying significant advantages in an organic EL device according to the present invention. In this experiment, organic EL devices having mixing-preventing layers 6 on hole injection layers 4 composed of PEDOT/PSS and an organic EL device not having a mixing-preventing layer were used. The thicknesses of the mixing-preventing layers 6 were 0.5, 1.0, 3.0, or 5.0 nm.

As shown in FIG. 3, it was confirmed by this experiment that the static contact angles (°) with toluene and water were increased with the thickness of the mixing-preventing layer 6. That is, the repellency to the solvent (toluene or water) was increased with the thickness of the mixing-preventing layer 6. When the mixing-preventing layer 6 was not provided (thickness: 0.0 nm), the hole injection layer 4 was dissolved in water, and therefore the measurement was not conducted.

Thus, when a solvent (toluene in the above-mentioned experiment) containing a material for the luminescent layer 5 was applied on the mixing-preventing layer 6, the luminescent layer 5 was formed without adhering to the mixing-preventing layer 6 because of the repellency. That is, the mixing-preventing layer 6 effectively prevented materials constituting the hole injection layer 4 and the luminescent layer 5 from mixing with each other.

The initial brightness shown in FIG. 3 was defined as brightness when a predetermined voltage was applied to an organic EL element. In order to simplify the description, the brightness when a predetermined voltage was applied to an organic EL device not having the mixing-preventing layer, i.e., having a lamination of a hole injection layer and a luminescent layer was defined as a reference value (1.0).

As shown in FIG. 3, it was confirmed that the initial brightness of an organic EL device was decreased with an increase in the thickness of the mixing-preventing layer 6. This is because that the distance between the anode and the cathode is increased with the thickness of the mixing-preventing layer 6 and thereby a current is apt not to flow in the luminescent layer 5 to reduce the brightness in the luminescent layer 5.

The initial efficiency shown in FIG. 3 was a ratio (cd/A) of the initial brightness (cd; candela) to the current (A; ampere) flowing between electrodes at the initial brightness, and the initial efficiency of the organic EL device not having a mixing-preventing layer was used as a reference value (1.0). It was confirmed that the current was apt not to flow in the luminescent layer 5 with an increase in the thickness of the mixing-preventing layer 6 and thereby the initial efficiency was also decreased as in the initial brightness.

The lifetime shown in FIG. 3 was a half-time determined by measuring the time necessary to reduce a predetermined brightness to the half. The measurement of the lifetime of each organic EL device was conducted by adjusting brightness of each organic EL device to the reference value (initial brightness) by controlling the voltage applied to between the electrodes. In this occasion, the power consumptions were high in organic EL devices in which a current was apt not to flow between the electrodes, i.e., in organic EL devices having mixing-preventing layers with large thicknesses, but the lifetimes of such organic EL devices were extended by providing the mixing-preventing layers 6.

It was confirmed by the above-mentioned experiment that a mixing layer, which would be formed at the interface of the hole injection layer 4 and the luminescent layer 5 by the mixing of the materials constituting the hole injection layer 4 and the luminescent layer 5, was prevented to be formed by providing a mixing-preventing layer 6 between the hole injection layer 4 and the luminescent layer 5, and the lifetime of an organic EL element could be extended.

Furthermore, when the thickness of the mixing-preventing layer 6 was 5 nm, the lifetime was about 1.2 times that of a conventional structure not having the mixing-preventing layer 6. When the thickness was 1 to 3 nm, the lifetime was about 1.4 times that of a conventional structure. In other words, an organic EL device 100 with a mixing-preventing layer 6 having a thickness of about 1 to 3 nm is preferred for extending the lifetime of the organic EL device 100.

As described above, though the lifetime of an organic EL device 100 could be extended by providing a mixing-preventing layer 6 (film thickness: 0.5 to 5 nm), the initial brightness and the initial efficiency were decreased with an increase in the thickness of the mixing-preventing layer 6. Therefore, when the lifetime is higher priority because of its application, it is desirable that a mixing-preventing layer 6 have a thickness of about 1 to 3 nm, and it is desirable that a mixing-preventing layer 6 have a thickness of about 0.5 nm for extending the lifetime while inhibiting decreases in the initial brightness and the initial efficiency.

The entire disclosure of Japanese Patent Application No. 2006-269922, filed Sep. 29, 2006 is expressly incorporated by reference herein.

What is claimed is:

1. An organic electroluminescence device comprising:
   a pair of electrodes;
   a hole injection layer and a luminescent layer disposed between the pair of electrodes; and
   a mixing-preventing layer disposed between the hole injection layer and the luminescent layer and preventing mixing of the material constituting the hole injection layer and the material constituting the luminescent layer, wherein the mixing-preventing layer is composed of a material containing a polymerized fluoroaliphatic group-containing monomer as a main ingredient, and
the fluoroaliphatic group-containing monomer is 2-(perfluorooctyl)ethyl methacrylate.

2. The organic electroluminescence device according to claim 1, wherein the mixing-preventing layer has a thickness of 5 nm or less.

3. A method of manufacturing an organic electroluminescence device having a hole injection layer and a luminescent layer between a pair of electrodes, the method comprising:
forming the hole injection layer;
forming a mixing-preventing layer which is composed of a material containing a polymerized fluoroaliphatic group-containing monomer as a main ingredient and prevents mixing of the hole injection layer and the luminescent layer on the hole injection layer; and
forming the luminescent layer on the mixing-preventing layer,
wherein the fluoroaliphatic group-containing monomer is 2-(perfluorooctyl)ethyl methacrylate.

4. The method of manufacturing an organic electroluminescence device according to claim 3, wherein the mixing-preventing layer is formed by
applying a fluorine group-containing high molecular precursor monomer on the hole injection layer by a liquid-phase method; and
thermally curing the high molecular precursor monomer for crosslinking and polymerization.

5. The method of manufacturing an organic electroluminescence device according to claim 3, wherein the mixing-preventing layer is formed so as to have a thickness of 5 nm or less.

6. An organic electroluminescence device comprising:
a pair of electrodes;
a hold injection layer and a luminescent layer disposed between the pair of electrodes; and
a mixing-preventing layer disposed between the hold injection layer and the luminescent layer and preventing mixing of the material constituting the hole injection layer and the material constituting the luminescent layer;
wherein the mixing-preventing layer is composed of a material containing a polymerized trifluoroethyl acrylate.

7. An organic electroluminescence device comprising:
a pair of electrodes;
a hold injection layer and a luminescent layer disposed between the pair of electrodes; and
a mixing-preventing layer disposed between the hold injection layer and the luminescent layer and preventing mixing of the material constituting the hold injection layer and the material constituting the luminescent layer;
wherein the mixing-preventing layer is composed of a material containing a polymerized trifluoroethyl methacrylate.

* * * * *